United States Patent [19]

Grandia et al.

[11] 4,084,354
[45] Apr. 18, 1978

[54] PROCESS FOR SLICING BOULES OF SINGLE CRYSTAL MATERIAL

[75] Inventors: Johannes Grandia; John Charles Hill, both of San Jose, Calif.

[73] Assignee: International Business Machines Corporation, Armonk, N.Y.

[21] Appl. No.: 803,082

[22] Filed: Jun. 3, 1977

[51] Int. Cl.² .............................................. B24B 1/02
[52] U.S. Cl. ................................. 51/283 R; 51/73 R; 51/327; 125/13 R
[58] Field of Search ....................... 51/283, 327, 73 R; 125/13 R

[56] References Cited

U.S. PATENT DOCUMENTS

| | | | |
|---|---|---|---|
| 3,039,235 | 6/1962 | Heinrich | 51/73 R |
| 3,626,644 | 12/1971 | Cupler | 51/283 |
| 3,662,733 | 5/1972 | Okamoto | 125/13 R |

Primary Examiner—Harold D. Whitehead
Attorney, Agent, or Firm—Joseph E. Kieninger

[57] ABSTRACT

A process for slicing boules of a single crystal material such as gadolinium gallium garnet (GGG) into wafers is described. The boule is prepared, by grinding preferably, so that the longitudinal boule axis corresponds to the crystallographic orientation axis of the boule. The boule is then mounted in a fixture and aligned so that the common longitudinal axis and crystallographic orientation axis is perpendicular to the saw blade. The boule is then rotated while maintaining the orientation of the combined common axis and engaged against an inner diameter rotating saw blade for a time sufficient for the blade to slice through the boule and form a wafer. The wafers obtained by this slicing process may be directly polished without the conventional lapping step to form a wafer having a surface that is substantially flat, parallel and defect free.

10 Claims, 7 Drawing Figures

FLOW DIAGRAM

PRIOR ART – ROTATING BOULE

PRIOR ART – BOULE

PRIOR ART - NON ROTATING BOULE

PRIOR ART - BOULE AXES

FLOW DIAGRAM

SUBJECT PROCESS - ROTATING BOULE

BOULE AXES

PROCESS FOR SLICING BOULES OF SINGLE CRYSTAL MATERIAL

FIELD OF THE INVENTION

This invention relates to slicing boules and more particularly to a process for slicing hard single crystal materials such as gadolinium gallium garnet (GGG) and sapphire.

DESCRIPTION OF THE PRIOR ART

In the commercial production of semi-conductor devices large single crystal boules or ingots of silicon or germanium have been sliced into wafers. Originally, the silicon boules were sliced by a rotary diamond saw having the outer periphery or cutting edge of the disk embedded with diamond dust. This cutting method, commonly referred to as the outer diameter (O.D.) method was soon discontinued because the thick blade wasted excessive material during the cutting operation. In addition, the side-to-side vibration of the blade in the O.D. method damaged the sides of the wafer significantly and this damage had to be removed in order to make the surface of the wafer usable.

The semiconductor industry soon adopted the so-called inner diameter (I.D.) cutting method having an annular discoid configuration, mounted by suitable means engaging its outer circumference and having its cutting edges on its inner circumference. The U.S. Patent to Winkler et al, No. 3,025,738, and the U.S. Patent to Heinrich No. 3,039,235, describe early I.D. cutting apparatus approaches to slicing silicon wafers. This prior art approach is shown in FIGS. 1 and 1A where a silicon boule 10 is rotated and moved so that it engages the cutting edge 12 of the I.D. cutting blade 14. The boule 10 is maintained in an upright position so that its longitudinal axis 16 (shown in FIG. 1A) is perpendicular to the cutting blade 14. These patents did not consider the crystallographic orientation of the silicon boule. The silicon boule 10 shown in FIG. 1A had a crystallographic orientation axis 20 which was, in most cases, at least 3° to 4° different from the longitudinal axis 16. As a result the wafers obtained by this method did not have a critical (1,1,1) or 1,1,0) crystallographic orientation which is necessary for use in semiconductor devices.

The semiconductor industry shortly thereafter adopted a procedure which is described in the U.S. Patent to Okamoto, No. 3,662,733 in which the boule is not rotated. As shown in FIGS. 2 and 2A, the boule 30 is aligned so that the longitudinal axis 36 of the boule 30 is at an angle to the cutting blade 34 while the crystallographic orientation axis is perpendicular to the cutting blade 34. The non-rotating boule is then moved against the cutting blade edge 32 while maintaining the boule alignment until a wafer has been sliced from the boule. The semiconductor industry has found that this method produces wafers having the proper (1,1,1) or 1,1,0) orientation as long as the boule alignment is held to within ±0.5°.

Presently the emergence of the magnetic bubble domain technology has caused a need for slicing hard single crystal boules of garnet materials such as gadolinium gallium garnet, which is commonly referred to as GGG. GGG is a much harder material than silicon and has a knoop hardness of about 1200 as compared to 650 for silicon. The bubble domain industry and its vendors have heretofore adopted the method described in FIG. 2 to slice the garnet boules. However, the increased hardness of the GGG material caused several problems with this slicing method that are not present with silicon.

One major problem is the reduced I.D. saw blade lifetime. Whereas one I.D. blade could be used to slice about 2000 silicon wafers, the same I.D. blade could only be used to slice about 25–50 GGG wafers of the same size. The number of the additional blades required as well as the time and labor used in changing the blades increases the cost of slicing GGG boules significantly.

Magnetic bubble domain devices require a GGG surface that is smooth, flat, parallel and substantially free of lattice distortions. GGG wafer surfaces obtained by slicing with the conventional non-rotating boule I.D. saw method are rough, not flat, not parallel i.e. wedge shaped, and they have lattice distortions to a significant depth. In order to use these wafers it is necessary to process the wafers with a lapping step and a polishing step for both sides of the wafer. The lapping steps increase the cost of the finished wafer significantly because this step is time consuming and because it consumes a considerable amount of wafer material.

SUMMARY OF THE INVENTION

It is a primary object of this invention to provide an improved process for slicing single crystal boules.

It is another object of this invention to provide an I.D. thin saw blade process for slicing single crystal boules having a knoop hardness greater than 700.

It is yet another object of this invention to provide a wafer slicing process having an improved saw blade lifetime.

It is a further object of this invention to provide a wafer slicing process which yields a smooth wafer surface.

It is still another object of this invention to provide a method for slicing single crystal boules which yield a flat, parallel wafer surface having relatively few lattice distortions.

It is a still further object of this invention to provide a process for slicing boules which yield a wafer surface suitable for polishing without an intermediate lapping step.

These and other objects are accomplished by a method for slicing boules of a hard single crystal material such as gadolinium gallium garnet into wafers. The boule is prepared, by grinding preferably, so that the longitudinal boule axis corresponds to or is parallel to the crystallographic orientation axis of the boule. The boule is then mounted in a fixture and aligned so that the common longitudinal axis and crystallographic orientation axis is perpendicular to the saw blade. The boule is then rotated while maintaining the orientation of the combined common axis and engaged against an inner diameter rotating saw blade for a time sufficient for the blade to slice through the boule and form a wafer. The wafers obtained by this slicing process are flat, parallel, relatively smooth, and have relatively few lattice distortions. These wafers may be directly polished without the conventional lapping step to form a wafer having a smooth, flat surface that is substantially defect free.

Other objects of this invention will be apparent from the following detailed description, reference being made to the accompanying drawings wherein a preferred embodiment of the invention is shown.

DESCRIPTION OF THE ILLUSTRATIVE EMBODIMENT

Figure 1:
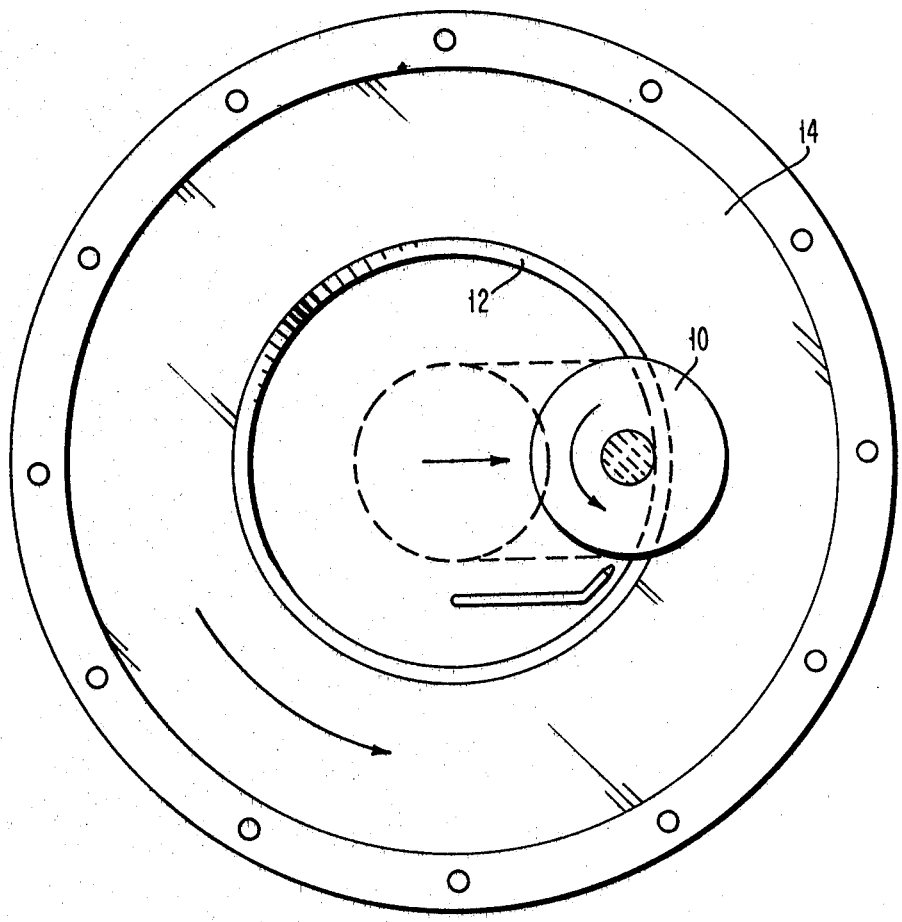
FIG. 1 is a top view of a prior art rotating boule I.D. slicing system.
Figure 1A:
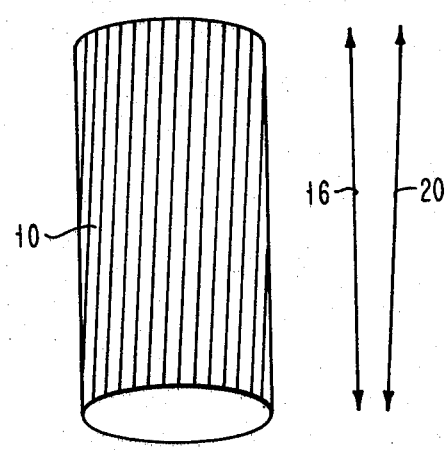
FIG. 1A is a cross-sectional view of the boule of FIG. 1.
Figure 2:
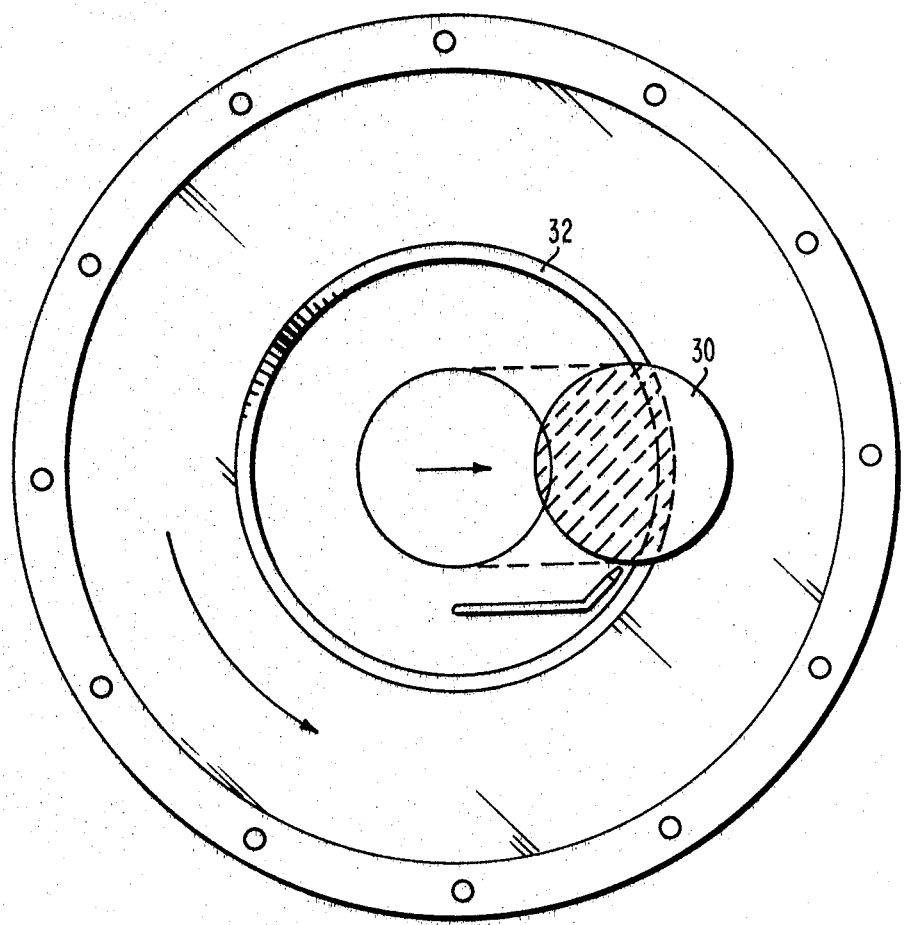
FIG. 2 is a top view of a prior art non-rotating boule I.D. slicing system.
Figure 2A:
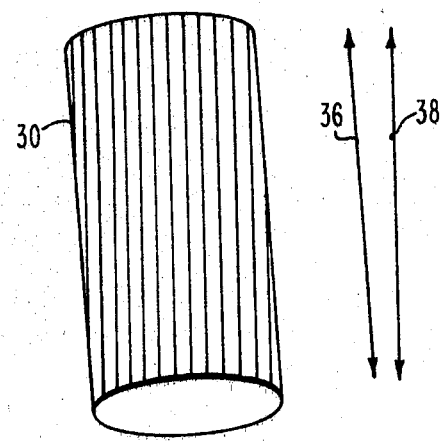
FIG. 2A is a cross-sectional view of the boule of FIG. 2.
Figure 3:
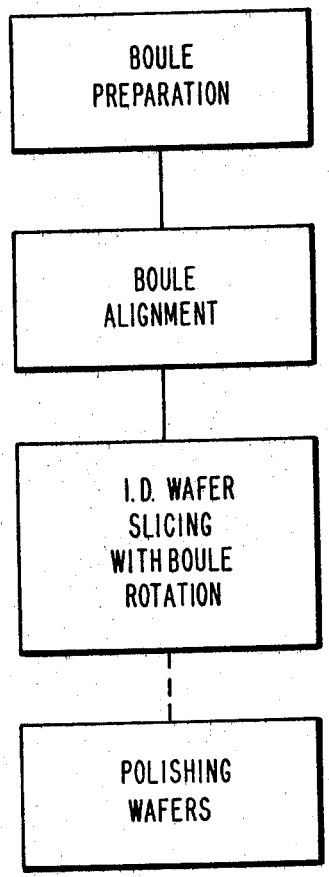
FIG. 3 is a flow diagram depicting the subject process.

As shown in FIG. 3 the first step in the applicant's wafer slicing process is the boule preparation. The boule of single crystal material, such as gadolinium gallium garnet (GGG), is grown by the conventional methods, such as the Czochralski method. This wafer slicing process is applicable to any single crystal material but is highly suited for hard single crystal materials having a hardness greater than about 700 knoop hardness. The process will be described using a single crystal GGG boule but it is understood that it is suitable for any hard single crystal material such as other garnets, sapphire and the like.

The crystallographic orientation of the GGG boule is determined by a suitable method, for example, by the conventional X-ray technique. After the crystallographic orientation of the boule has been determined, the boule is ground in a manner such that the crystallographic orientation 40 is parallel to or corresponds to the longitudinal boule axis 42 of the boule 44 as shown in FIG. 4A. The crystallographic orientation axis and the longitudinal axis should be within 0.05°. If the crystallographic orientation axis and the longitudinal axis are not substantially the same, the resultant wafers that are sliced would not have the proper crystallographic orientation.

The next step is the boule alignment. The boule 44 that has been treated as shown in FIG. 4A is then mounted in a boule holder having a chuck or other suitable means 46 for clamping or otherwise mounting the boule 44. The boule holder means 46 is connected to means not shown suitable for rotating the boule 44 while at the same time maintaining the precise alignment of the boule 44.

Figure 4:
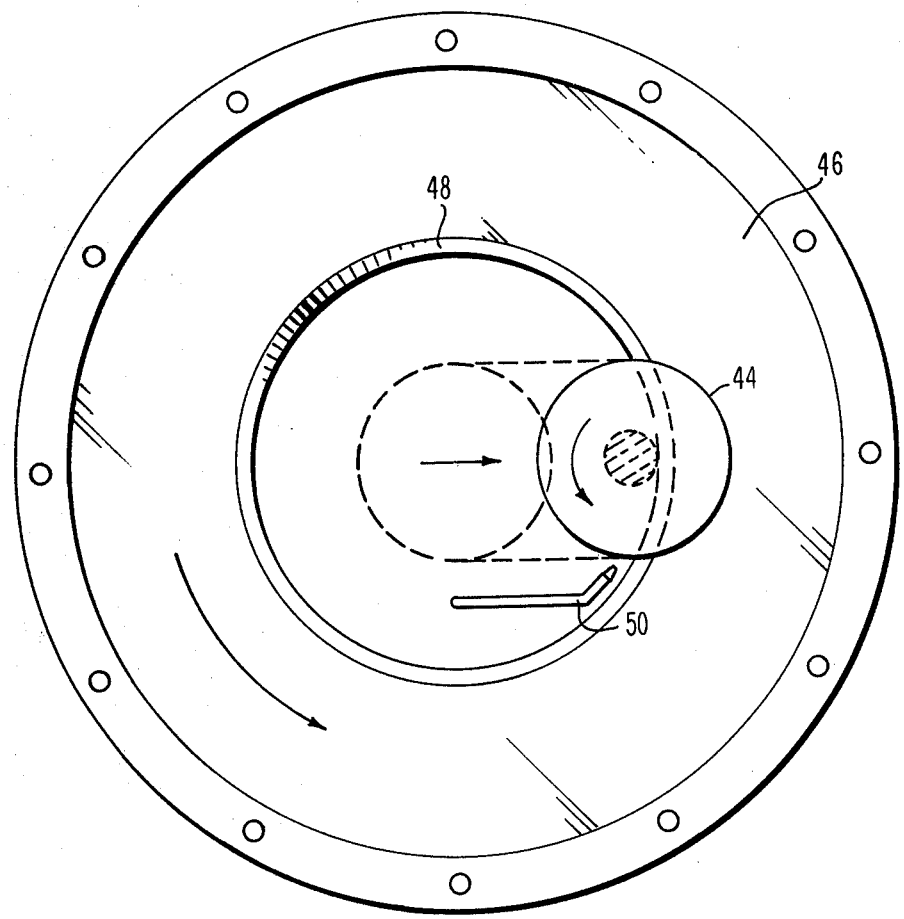
FIG. 4 is a top view of the subject process rotating boule I.D. slicing system.
Figure 4A:
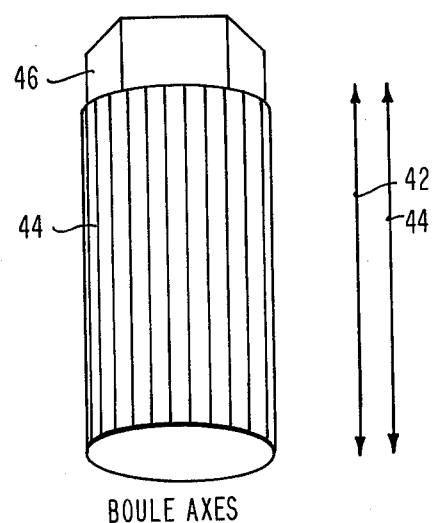
FIG. 4A is a cross-sectional view of the boule of FIG. 4.

The boule 44, as shown in FIG. 4, is mounted so that both the crystallographic orientation and the boule longitudinal axis are aligned perpendicular to the I.D. saw blade 46. The saw blade 46 has an inner cutting edge 48. The boule 44 is rotated and moved so that it engages the cutting edge 48. During the slicing operation, cooling and/or lubricating fluid is directed against the boule-cutting edge interface from the jet 50. The cutting blade 46 rotates one direction while the boule 44 rotates preferably in the same direction. Alternatively, the boule may be rotated in the opposite direction to the cutting blade rotation direction. The direction that the coolant flow is applied may also be varied. Typically, the cutting blade 46 is rotated at a relatively high speed, that is, 2000 to 2500 rpm's by a suitable belt or gear drive (not shown).

The boule 44 rotates about its axis at a relatively slow rate of speed which depends to a large extent upon the bearings in the boule rotating gear means as well as the saw blade spindle. For example, air bearings or hydrostatic bearings permit a higher rotation generally than rotating means employing ball bearings. The highest speed that these can be run need to be determined for the individual rotating means. In general, a rotating speed of 10 to 100 rpm's may be employed depending upon the rotating means. However, some rotating means do not permit rotating speeds at the upper end of the range set forth. As shown in the following table, the rotating speeds were varied for one particular rotating system.

| Ex. No. | Boule Rotating Speed, RPM | Number of 2" GGG Wafers | Saw Damage Depth | Number of Wafers per blade dressing | Flatness "/" T.I.R. | Parallelism "/" T.I.R. |
|---|---|---|---|---|---|---|
| 1 | 0 | 25 | Pass | 5 | 0.0010 | 0.0005 |
| 2 | 30 | 85 | Pass | 17 | 0.0002 | 0.0002 |
| 3 | 45 | 192 | Pass | 38 | 0.0002 | 0.0002 |
| 4 | 50 | a | Fail | — | — | — | a Excessive saw damage

In example No. 1, where there was no boule rotation, 25 2 inch GGG wafers were sliced until the blade failed. In accordance with this invention, as shown in example 2, with a boule rotating speed of 30 rpm's, 85 wafers were sliced before saw blade failure. In example No. 3 with a boule rotating speed of 45 rpm's, 192 wafers were obtained.

In example No. 4, at a boule rotating speed of 50 rpm's, the vibration caused the wafers to be too rough to be used, i.e. excessive saw damage. The saw damage depth of the wafer slices was evaluated by a conventional polishing technique employing colloidal silica. The average saw damage depth was acceptable for Examples 1, 2 and 3. However, it was easier to keep the saw damage depth acceptable in Examples 2 and 3 than in the prior art Example 1. This is illustrated by the number of times the saw blade had to be dressed. In Example 1, the blade had to be dressed after every 5 wafers whereas 17 and 38 wafers were cut between dressings in Examples 2 and 3, respectively.

The flatness and parallelism were checked with conventional dial indicators which yielded values in inch/inch total indicated runout (T.I.R.). The flatness values of 0.0002 for Examples 2 and 3 were better than the value of 0.0010 obtained for prior art Example 1. The parallelism values of 0.0002 for Examples 2 and 3 were also better than the value of 0.0005 obtained for prior art Example 1. The wafers of Examples 2 and 3 were examined visually and found to have a smooth ground surface.

The improved flatness and parallelism of the wafers as well as the reduced lattice distortion permit a GGG wafer to be polished directly without lapping the wafer surfaces. The wafer obtained in Example 1 had to be lapped on both surfaces and polished on both surfaces to be flat and parallel enough and have a sufficiently low defect concentration to be suitable for use in bubble devices. Examples 2 and 3 yielded wafers that were of similar quality, suitable for use in bubble devices, by polishing on both sides without the lapping steps. A variation to this approach would be to lap one side of the GGG wafer to provide an ultra high quality wafer.

This process is particularly useful for hard single crystal materials such as GGG, garnets, sapphire and the like because it enables these hard materials to be sliced easier than conventional methods as well as yielding a superior wafer. This process can also be used to good advantage on softer single crystal materials such as silicon and germanium where flatness and parallelism is still a problem.

Although a preferred embodiment of this invention has been described, it is understood that numerous variations may be made in accordance with the principles of this invention.

What is claimed is:

1. A method of slicing a boule of a hard single crystal material comprising the steps of
   treating the surface of said boule to provide said boule with a longitudinal axis that is substantially the same as the crystallographic axis,
   positioning said treated boule to have an orientation substantially perpendicular to an inner diameter rotatable saw blade,
   rotating said boule about said longitudinal axis while maintaining said orientation, and
   engaging said rotating boule against said rotating saw blade whereby a wafer is sliced from said boule.

2. A method as described in claim 1 whereby the boule surface is treated so that the longitudinal axis is within 0.1° of the crystallographic axis.

3. A method as described in claim 1 whereby the boule surface is treated so that the longitudinal axis is within 0.05° of the crystallographic axis.

4. A method as described in claim 1 whereby the boule is rotated at between 10 to 100 rpm without vibrations that adversely affect the wafer surface.

5. A method as described in claim 4 whereby the boule is rotated at between 10 to 45 rpm.

6. A method as described in claim 1 whereby the boule and the saw blade rotate in the same direction.

7. A method as described in claim 1 whereby the boule and the saw blade rotate in opposite directions.

8. A method of slicing a boule of a hard single crystal material comprising the steps of
   treating the surface of said boule to provide said boule with a longitudinal axis that is substantially the same as the crystallographic axis,
   positioning said treated boule to have an orientation substantially perpendicular to an inner diameter rotatable saw blade,
   rotating said boule about said longitudinal axis while maintaining said orientation,
   engaging said rotating boule against said rotating saw blade whereby a wafer is sliced from said boule, and
   polishing said wafer for a time sufficient to provide a smooth surface that is flat and parallel.

9. A method as described in claim 8 including the step of polishing the wafer on the second surface.

10. A method as described in claim 9 including the step of lapping one surface of the wafer prior to polishing.

* * * * *